United States Patent [19]

Swensen et al.

[11] Patent Number: 4,644,443
[45] Date of Patent: Feb. 17, 1987

[54] COMPUTER COOLING SYSTEM USING RECYCLED COOLANT

[75] Inventors: Michael W. Swensen; William C. Martin; Henry H. Kight, all of Austin, Tex.

[73] Assignee: Texas Instruments Incorporated, Dallas, Tex.

[21] Appl. No.: 781,064

[22] Filed: Sep. 27, 1985

[51] Int. Cl.⁴ ............................................. H05K 7/20
[52] U.S. Cl. .................................. 361/384; 174/16 R; 361/390
[58] Field of Search ............................. 165/80.2, 80.3; 174/15 R, 16 R; 361/383, 384, 390, 415

[56] References Cited

U.S. PATENT DOCUMENTS

| 3,253,646 | 5/1966 | Koltuniah et al. | 361/384 |
| 3,387,648 | 6/1968 | Ward, Jr. et al. | 174/16 R |
| 3,749,981 | 7/1973 | Koltuniah et al. | 174/15 R |
| 3,967,874 | 7/1976 | Calabro | 361/384 |
| 4,291,364 | 9/1981 | Andros et al. | 361/384 |
| 4,399,485 | 8/1983 | Wright et al. | 361/383 |
| 4,502,100 | 2/1985 | Greenspan et al. | 361/384 |

FOREIGN PATENT DOCUMENTS

| 0110837 | 8/1980 | Japan | 361/384 |
| 0147458 | 11/1981 | Japan | 361/384 |
| 0700941 | 12/1979 | U.S.S.R. | 361/384 |

OTHER PUBLICATIONS

Hammer et al, "Ventilation System for Data Processing Systems", IBM Technical Disclosure Bulletin, vol. 17, No. 9, 2/75, pp. 2529-2530.

Primary Examiner—A. D. Pellinen
Assistant Examiner—Greg Thompson
Attorney, Agent, or Firm—Thomas G. Devine; Leo N. Heiting; Melvin Sharp

[57] ABSTRACT

An enclosed, electronic system has a plurality of lower power-dissipating electronic components mounted on a chassis. The components are positioned adjacent each other to form low volume fluid ducts therebetween. A low volume fluid duct is formed between one side of the plurality and one end enclosure of the system. At least one higher power-dissipating electronc component is also mounted on the chassis, forming a high volume fluid duct between one of its sides and one side of the last of the lower power-dissipating electronic components, and a high volume fluid duct also formed between the other side of the higher power-dissipating electronic component and the other end enclosure. Air is caused to blow through the low volume fluid duct and then to be exhausted through the high volume fluid ducts. The rate of air flow through the high volume ducts is one half of the minimum required to cool the higher power-dissipating component. The rate of air flow through the low volume fluid ducts is at least one half of that required to cool each of the lower power-dissipating electronic components. By exhausting the cooling air from the low volume fluid channels through the high volume fluid ducts, the air flow required is less than the total required for the low volume fluid ducts plus the high volume fluid ducts.

6 Claims, 5 Drawing Figures

COMPUTER COOLING SYSTEM USING RECYCLED COOLANT

BACKGROUND OF THE INVENTION

1. Field of the Invention

This invention relates to the cooling of components in electronic systems and more particularly to the cooling of lower power-dissipating components by directing cool air over them and then redirecting the heated air over the higher power-dissipating electronic components in a system.

2. Description of the Prior Art

Present cooling systems group all electronic components together and move air across them with a fan or a group of fans. This type of system tends to provide even air flow through all ducts formed between components. Furthermore, the air flow may be much more than needed for some of the components in such systems. The cooling air is used only once to cool the heat generating components, whether they are of the low or high power dissipating types.

Typical computer electronic components, with a relatively high power consumption, require forced air cooling. In a given chassis, the various components may have different levels of power consumption. Therefore, the cooling (i.e. air flow) requirements will differ from component to component. Higher power consumption requires greater air flow. The computer components are cooled using some type of fan (or fans) which either blow air into or draw air through the ducts.

Because of cost and noise considerations, it is desirable to use as few fans (or as small a fan) as possible.

BRIEF SUMMARY OF THE INVENTION

This invention provides for first cooling the lower power-dissipating electronic components, with relatively even distribution, from component to component. The air is then redirected over the higher power-dissipating electronic components. Because the air flows first over the cooler components, its temperature rise will not be great. Furthermore, in the temperature ranges expected, the specific heat of the air is relatively constant. Therefore, the air's ability to absorb heat is not diminished when its temperature rises slightly.

The principal object of this invention is to reduce the volume of cooling air required to cool components in an electronic system.

Another object of this invention is to provide cooling for the components in an electronic system using smaller and/or fewer fans.

Still another object of this invention is to reduce the noise level for cooling components in an electronic system.

Another object of this invention is to reduce the power required to provide cooling of components in an electronics system.

These and other objects will be made evident in the detailed description that follows.

DETAILED DESCRIPTION OF THE INVENTION

Most electronic systems are designed to use parallel paths of cooling air to cool the electronic components making up that system. This means that each component receives about the same amount of air flow. Consequently, the total flow is dictated by the cooling requirements of the component with the highest power dissipation. The fan or fans that are used for moving air move more air than is really necessary. This excess air produces excess noise and requires more power.

In this preferred embodiment, a computer system uses six electronic components with power dissipations ranging from 20 to 60 watts. A seventh component dissipates 160 watts. Obviously, the seventh component requires more air flow than the others.

Figure 2A:
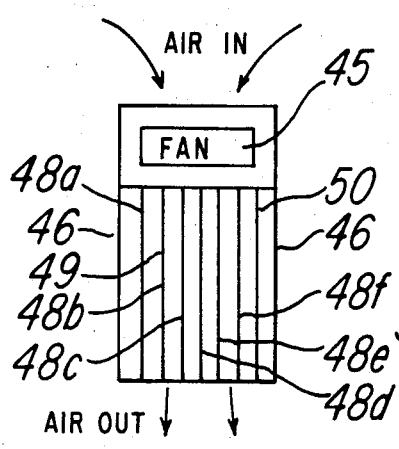
FIGS. 2a and 2b schematically represent prior art cooling systems.
Figure 2B:
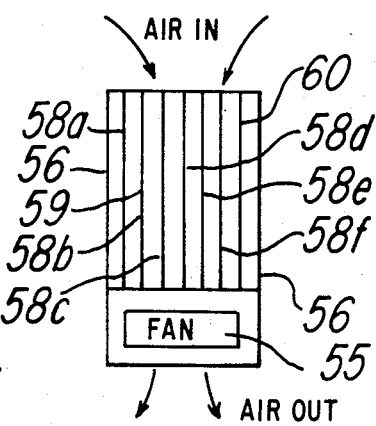

Using an airflow measurement bench, it was determined that a 60 watt electronic component could be cooled with approximately 33 cubic feet of air per minute. A 160 watt electronic component requires about 115 cubic feet per minute. The prior art approach as shown in FIGS. 2a and 2b to this particular problem would result in a total airflow requirement of 460 cubic feet per minute. That is, each component has air flowing over its top and bottom surface so that its total requirement on each side is one half that for the entire component. For example, the 160 watt component (48a–48f, FIG. 2a; 58a–58f, FIG. 2b) requiring approximately 115 cubic feet per minute for cooling would have 57½ cfm passing on both sides. Since that is the highest requirement and since there are seven electronic components (48a–48f, 50, FIG. 2a; 58a–58f, 60, FIG. 2b), the prior art approach is to provide 57½ cfm per channel (8 channels) for a total of 460 cfm.

Figure 3:
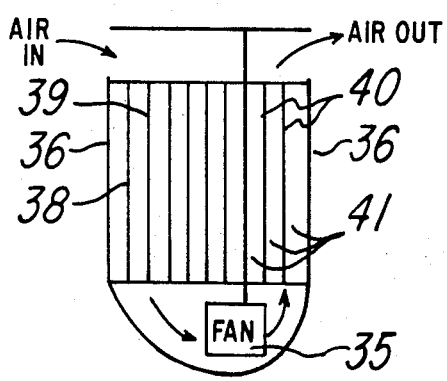
FIG. 3 schematically illustrates the cooling system of this invention.
Figure 4:
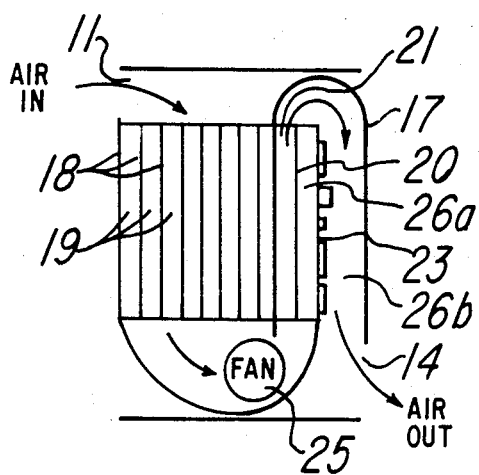
FIG. 4 schematically illustrates the cooling system of this invention with the further cooling of a power supply.

In the inventive approach, as shown in FIGS. 3 and 4, air is drawn in (FIG. 4) through inlet 11 and blown over components 18 through ducts 19, through fan 25 and into ducts 21 over high power dissipation component 20. The temperature rise is only another 2 degree centigrade. In this preferred embodiment, the air is then guided by deflector 17 over power supply 23, cooling it and discharging through air outlet 14.

As can be seen, using the cooling air in this manner, the total flow requirement is limited to 115 cfm, only 25% of that required using the conventional approach. This results in a much quieter, more efficient cooling system.

FIGS. 2a and 2b simply show the prior art with FIG. 2a illustrating a fan 45 positioned at the top of an electronic system for drawing air in and, then blowing the air over electronic components 48 within enclosure 46 through ducts 49. FIG. 2b, on the other hand, has a fan 55 at the bottom of an electronic system, pulling air over electronic components 58 within enclosure 56 through ducts 59. As indicated earlier, in both cases, the highest power dissipating components dictate the amount of air that will be caused to pass through the ducts.

FIG. 3 illustrates the invention, where air is brought in at the top and passed over electronic components 38 through ducts 39, these electronic components 38 within enclosure 36 being of the lower power-dissipating type. Fan 35 then propels the air over the higher power-dissipating components 40 through ducts 41.

Figure 1:
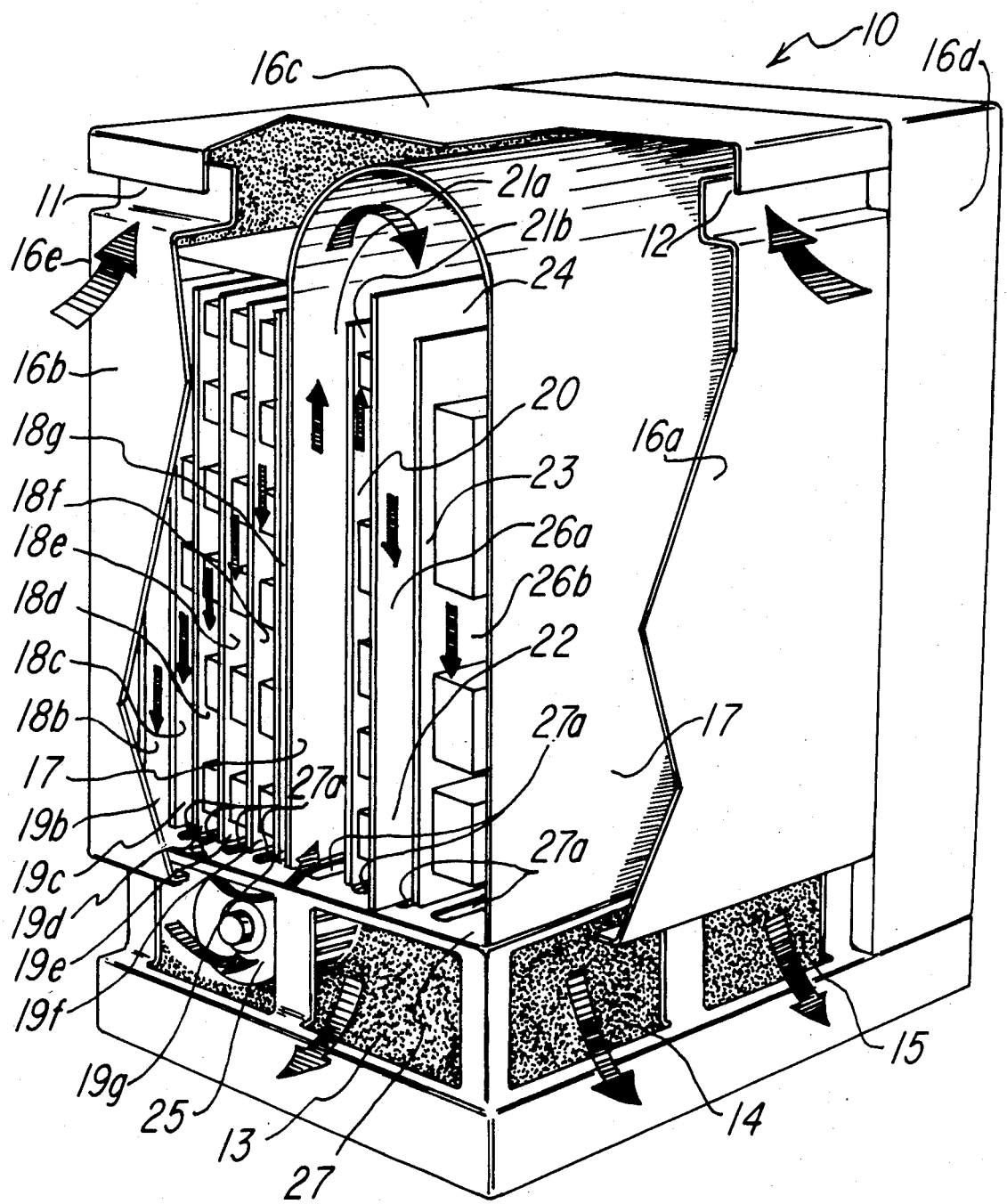
FIG. 1 is a partial cut-away perspective of the electronic system.

FIG. 4 schematically illustrates this invention but an examination of FIG. 1 is helpful in visualizing the system 10.

Air inlets 11 and 12 formed between enclosure sections 16b and 16c, and between 16a and 16c, respectively, are shown with the air coming in indicated with a large arrow. As shown, the enclosure is made up of end enclosure section 16a, front section 16b, top section 16c, rear section 16d and end enclosure section 16e. The air then travels through ducts 19a-19g (duct 19a is not visible), cooling lower power-dissipating electronic components 18a-18g (component 18a is not visible). In this preferred embodiment, tangential fan 25 is located below the components and draws air as indicated through low volume ducts 19a-19g, sLots 27a and then expels the slightly heated air into high volume ducts 21a and 21b to cool higher Power dissipating electronic component 20. Deflector 17, mounted on chassis 27, is shown dividing the lower power dissipating section from the higher power-dissipating section. Furthermore, deflector 17 directs the air that has cooled component 20 over a power supply 23 by passing the exhaust air through high volume ducts 26a and 26b, with deflector 24 providing a separation between the higher power dissipating component area and the power supply area. Air is exhausted through exhaust ports 13, 14 and 15 as indicated by the heavy arrows.

Referring to FIG. 1, it can be seen that six electronic components of a maximum of 60 watts are to be cooled. It has been empirically determined that these components require 33 cfm to cool.

The higher power dissipating electronic component dissipates 160 watts and requires 115 cfm to cool.

The flow per duct equals the total flow required divided by two. Therefore, for the lower volume ducts 19a-19g, the power requirement is $7 \times 16\frac{1}{2} = 115\frac{1}{2}$ cfm.

Available then for the higher power dissipating electronic component 20, is $115\frac{1}{2}$ cfm or $57\frac{3}{4}$ cfm per duct. Obviously There is more than enough air available from the cool section to cool the hotter section.

This preferred embodiment employs air as a coolant. However, attention is directed to U.S. Pat. No. 3,812,402 "High Density Digital Systems and Their Method of Fabrication with Liquid Cooling for Semiconductor Chips" issued May 21, 1974 and assigned to the assignee of this invention. This patent uses a florocarbon as a coolant, for example a type FC78 from the 3M Company. Such a liquid cooling system could be used by closing the inventive system and causing the liquid coolant to flow by operation of a pump in the same manner described for air.

The basic invention as set out herein is to redirect coolant from a plurality of lower power-dissipating electronic components to cool higher power-dissipating electronic components. Those skilled in the art may direct the coolant flow in opposite directions from that described in this preferred embodiment, use different flow rates, etc. Such changes are contemplated and this invention is limited only by the appended claims.

What is claimed is:

1. An enclosed computer cabinet having at least one chassis, first and second end enclosures, and intake and exhaust air vents, comprising:
   (a) a plurality of lower power-dissipating electronic components mounted adjacent each other on the chassis forming low volume air ducts between each other and between the first end enclosure and one side of the adjacent lower power-dissipating electronic components;
   (b) at least one higher power-dissipating electronic component mounted on the chassis, adjacent the second end enclosure, to form a high volume duct with one side of the higher power-dissipating electronic component;
   (c) deflector means, positioned between the lower power-dissipating electronic component furthest from the first end enclosure, to form a low volume air duct with one side of the furthest lower power-dissipating electronic component, and to form a high volume air duct with the other side of the higher power-dissipating electronic component; and
   (d) tangential fan means positioned to cause air to be drawn into the low volume ducts over both sides of each of the lower power-dissipating electronic components, and to exhaust through the high volume ducts over both sides of the higher power-dissipating electronic component, the rate of air flow in the high volume ducts being a minimum of one half of that required to cool the higher power-dissipating electronic component, and the rate of air flow in the low volume ducts being at least one half of that required to cool each of the lower power-dissipating electronic components.

2. The system of claim 1 wherein the deflector means comprises a directional portion to direct the air from the high volume ducts, the system further comprising:
   (e) a power supply electronic component, positioned adjacent the higher power-dissipating electronic component and the second end enclosure forming a pair of high volume ducts through which the air from the high volume ducts is passed to cool the power supply electronic component.

3. An enclosed electronic system having a chassis, an enclosure having a top and first and second end enclosures, and cooling fluid, comprising:
   (a) at least a first and a second lower power-dissipating electronic component mounted adjacent each other on the chassis, forming a first fluid duct between one side of the first component and the first end enclosure, and a second fluid duct between the other side of the first component and one side of the second component;
   (b) at least one higher power-dissipating electronic component mounted on a chassis adjacent the second component, forming a third fluid duct between one side of the higher power-dissipating electronic component and the other side of the second component, and forming a fourth fluid duct between the other side of the higher power-dissipating electronic component and the second end enclosure; and
   (c) pump means, positioned within the system to cause at least one half of the minimum cooling fluid required to cool the higher power-dissipating electronic component to first be drawn through each of the first and second fluid ducts, and then exhausted through each of the third and fourth ducts.

4. The system of claim 3 wherein the cooling fluid comprises air and the system includes air inlets and air exhaust vents formed in the enclosure.

5. The system of claim 2 wherein the pump means comprises fan means.

6. The system of claim 5 wherein a plurality in excess of two of lower power-dissipating electronic components is provided, positioned adjacent each other, forming low volume fluid ducts between each other, the first fluid duct being formed between one side of the first of the lower power-dissipating electronic components and the first end enclosure, and the nth fluid duct being formed between the other side of the lower power-dissipating electronic component positioned furthest from the first end enclosure and the one side of the higher power-dissipating electronic component.

* * * * *